(12) United States Patent
McSchooler et al.

(10) Patent No.: US 11,531,050 B2
(45) Date of Patent: Dec. 20, 2022

(54) METHODS, SYSTEMS, AND APPARATUS FOR LOW-POWER, WIRELESS, POWER LINE FAULT DETECTION

(71) Applicant: DISH Network L.L.C., Englewood, CO (US)

(72) Inventors: Jeffrey Lang McSchooler, Parker, CO (US); Henry Gregg Martch, Parker, CO (US)

(73) Assignee: DISH Network L.L.C., Englewood, CO (US)

( * ) Notice: Subject to any disclaimer, the term of this patent is extended or adjusted under 35 U.S.C. 154(b) by 444 days.

(21) Appl. No.: 16/723,858

(22) Filed: Dec. 20, 2019

(65) Prior Publication Data

US 2021/0190847 A1    Jun. 24, 2021

(51) Int. Cl.
*G01R 31/08* (2020.01)
*B64C 39/02* (2006.01)
*B64D 1/02* (2006.01)

(52) U.S. Cl.
CPC .......... *G01R 31/085* (2013.01); *B64C 39/024* (2013.01); *B64D 1/02* (2013.01); *B64C 2201/027* (2013.01); *B64C 2201/12* (2013.01)

(58) Field of Classification Search
CPC .......... H04L 1/0041; H04B 3/46; H04B 3/54; H04B 7/024
See application file for complete search history.

(56) References Cited

U.S. PATENT DOCUMENTS

| | | | |
|---|---|---|---|
| 9,413,156 B2 | 8/2016 | O'Brien et al. | |
| 2015/0099531 A1* | 4/2015 | Steiger | H04W 4/02 455/456.1 |
| 2017/0316701 A1* | 11/2017 | Gil | G08G 5/0069 |
| 2017/0318477 A1* | 11/2017 | Priest | B64D 47/08 |
| 2018/0035606 A1* | 2/2018 | Burdoucci | H04N 5/232935 |
| 2018/0238955 A1* | 8/2018 | Bango | G08B 21/02 |
| 2018/0252065 A1* | 9/2018 | Hemphill | E21B 47/001 |
| 2018/0265098 A1* | 9/2018 | Evans | B61B 1/02 |

OTHER PUBLICATIONS

Fairley, Peter "When Power Lines Break, a New Control System Keeps the Sparks from Flying", IEEE Spectrum downloaded from https://spectrum.ieee.org/energy/the-smarter-grid/when-power-lines-break-a-new-control-system-keeps-the-sparks-from-flying, Sep. 19, 2018, 2 pgs.

* cited by examiner

*Primary Examiner* — Jermele M Hollington
*Assistant Examiner* — Temilade S Rhodes-Vivour
(74) *Attorney, Agent, or Firm* — Perkins Coie LLP

(57) ABSTRACT

A drone deployable power line fault detection sensor. The sensor can include a clamp mechanism having a clamp ring with first and second ring portions movably connected to each other and a resilient member positioned to urge the first and second ring portions toward a closed configuration. A latch can be positioned to retain the first and second ring portions in an open configuration whereby the sensor can be positioned on a power transmission line with a drone. A trigger can be coupled to the latch and operative, under the weight of the sensor, to disengage the latch thereby releasing the first and second ring portions to close around the transmission line under the force of the resilient member. One or more sensors are carried by the clamp mechanism and positioned to detect a line fault on the power transmission line, which is reported to a power station control system to de-energize the power transmission line.

14 Claims, 4 Drawing Sheets

METHODS, SYSTEMS, AND APPARATUS FOR LOW-POWER, WIRELESS, POWER LINE FAULT DETECTION

TECHNICAL FIELD

The present technology is generally directed to power line fault detection. In particular, several embodiments of the present technology are related to downed power line detection sensors, systems, and methods.

BACKGROUND

Overhead high-voltage power transmission lines can be susceptible to downing or breakage due to wind, ice, trees, mechanical failure, and/or damage to supporting towers or poles. In the unfortunate event that a power line does contact the ground, it can produce electrical arcing that can ignite flammable materials, such as vegetation and trees, thereby starting a fire. It has been well documented that many fires have been started by downed power lines, in some cases resulting in significant forest fires, for example.

BRIEF DESCRIPTION OF THE DRAWINGS

The devices, systems, and methods described herein may be better understood by referring to the following Detailed Description in conjunction with the accompanying drawings, in which like reference numerals indicate identical or functionally similar elements.

Figure 1:
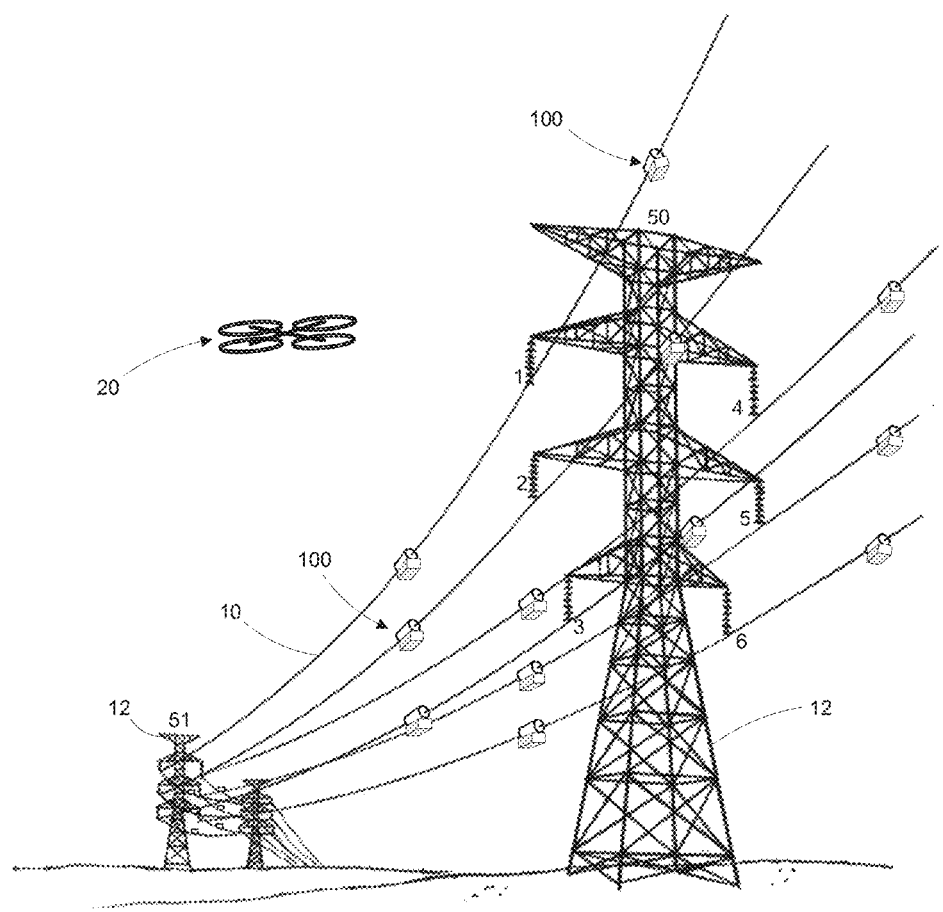
FIG. 1 is a perspective view illustrating multiple power line fault detection sensors, configured in accordance with embodiments of the present technology, deployed in an representative power line environment.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, combinations, equivalents, and alternatives falling within the scope of this disclosure.

DETAILED DESCRIPTION

Various examples of the systems and methods introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Disclosed is a network of low power, low cost power line sensors deployed on power transmission lines and configured to sense a downed or broken power line (i.e., line fault) and wirelessly notify a power station control system to de-energize the power system. The disclosed technology can not only detect line faults in a timely manner but also the fault's location to enable emergency response and rapid deployment of repair crews to get power back on-line to restore service and revenue. In some embodiments, the disclosed sensors can have low latency by using high-speed networks (e.g., 5G) and use various sensors and methods to detect the power line fault including measuring line inclination and measuring electro-magnetic (EM) fields generated by an active power line, for example. To simplify installation and reduce installation cost, the sensors can be installed on existing power lines using a drone that hangs the sensors directly on the power lines. In some implementations, the sensor's batteries can be inductively charged from the power line's EM fields.

As shown in FIG. 1, multiple power line sensors 100 can each be positioned on a corresponding transmission line 10. The sensors 100 can be deployed on the transmission lines 10 between each adjacent pair of towers 12. Accordingly, the location of a line fault can be determined based on which sensor 100 reports a fault, such as line inclination or lack of current. As described more fully below, the power line sensors 100 can be configured for drone deployment, for example. Thus, a drone 20 can deposit each sensor on a corresponding transmission line 10.

In some implementations, the location of each sensor 100 can be identified by tower number(s) and transmission line number. For example, a unique identifier corresponding to each sensor 100 can be associated with the tower numbers between which the sensor is located and the line number on which it is clamped. For example, a sensor 100 positioned between towers 50 and 51 on transmission line 2 can be associated with a location code 50-51:2. When the sensor reports a fault, it can include its unique identifier which can be cross-referenced to its location code to identify exactly which transmission line to shut down and where to send emergency and repair crews. Other suitable location codes can be used and in some implementations, each sensor can be programmed with its location as part of the deployment process such that it can directly transmit its location as part of a fault report.

Figure 2:
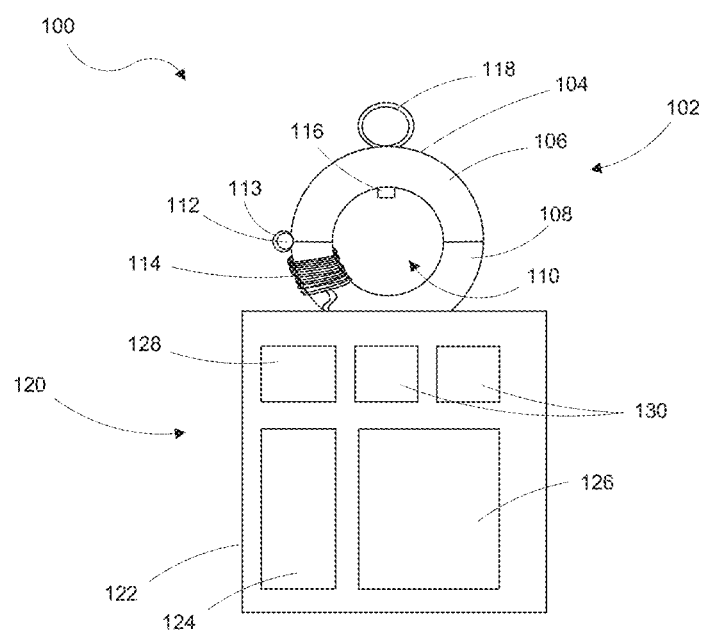
FIG. 2 is a schematic diagram of the power line fault detection sensors introduced in FIG. 1.

With reference to FIG. 2, the power line sensors 100 can include a line clamp mechanism 102 to secure the sensor 100 to a transmission line 10 (FIG. 1). The line clamp 102 can include a clamp ring 104 having first and second ring portions 106 and 108, respectively. The ring portions 106 and 108 can be connected together with a hinge 112, for example. In some implementations, the clamp 102 can include a resilient member, such as a torsion spring 113, positioned to urge the ring portions toward a closed configuration (e.g., normally closed). The clamp 102 can be retained (e.g., cocked) in an open position with a latch member 116, whereby the sensor 100 can be positioned on a transmission line 10 (e.g., via drone 20). The latch member 116 can be operatively coupled to a trigger 117 that when activated e.g., depressed by the weight of the sensor 100, for example, the latch member 116 is disengaged, thereby releasing the ring halves 106/108 to clamp around the transmission line 10 under the force of the spring 113. In some embodiments, the clamp ring 104 can include a ring or pad eye 118 to facilitate transport via a drone 20, for example.

Although the disclosed power line sensors have been described as being drone deployable, any suitable method of installing a power line sensor can be used. For example, the disclosed power line sensors can be deployed with traditional techniques and equipment including helicopters, bucket trucks, cranes, and/or insulating poles.

The clamp ring 104 can be the core for a clamp-type AC current sensor. The clamp ring 104 has a central opening 110 configured to receive a transmission line 10 (FIG. 1). Current running through the transmission line 10 can be detected and/or measured through induction by a coil 114 positioned around the clamp ring 104. In some embodiments, the coil 114 can also be used to inductively charge a battery 126 used to power the sensor 100. The line clamp 102 can also carry a sensor module 120 having a housing 122 enclosing various communication and sensor components. For example, the sensor module 120 can include a controller 124 (e.g., processor and memory), a battery 126, a communication module 128 and multiple sensors 130. The sensors 130 can include sensors for detecting, measuring, and/or deriving: electricity (e.g., current, voltage, EM fields), smoke, air quality, heat, ozone, noise, line swing (e.g., accelerometer), line inclination, wind direction, and/or ambient temperature, for example. The induction coil 114, for example, can detect electricity e.g., current, voltage, and/or EM fields.

The communication module 128 can be a wireless communication device using mobile communication technology such as 4G LTE or 5G, for example. However, any suitable wireless communication can be used. In some implementations, communication over the power transmission line may be used as well. In some embodiments, the communication module 128 can include GPS capability to help locate the sensor and any corresponding line fault. Furthermore, the location of the sensor can be derived from triangulation from cell towers. The battery 126 provides power to ensure that the power line sensor 100 can report a ground fault even after the transmission line energy is no longer available due to a break or other fault.

The power line sensors 100 can detect power line faults using one or more of the various sensors disclosed above. For example, a broken power line upstream of a power line sensor 100 can be identified by detecting a loss of current, voltage, and/or EM fields in the transmission line. A broken power line downstream of a power line sensor 100 can be identified by detecting changes in current, voltage, and/or EM fields in the transmission line indicating a ground fault of the energized transmission line. Changes in current, voltage, and/or EM fields can also indicate that a transmission line, although not necessarily broken, has otherwise come into contact with the ground or a tower causing a ground fault.

Accelerometers can indicate that a transmission line is swinging excessively which can be useful in anticipating a transmission line break. Inclination sensors and/or accelerometers can determine that a transmission line has broken and is falling. For example, if the inclinometer exceeds a threshold inclination the sensor 100 can identify that the transmission line has broken.

Figure 3:
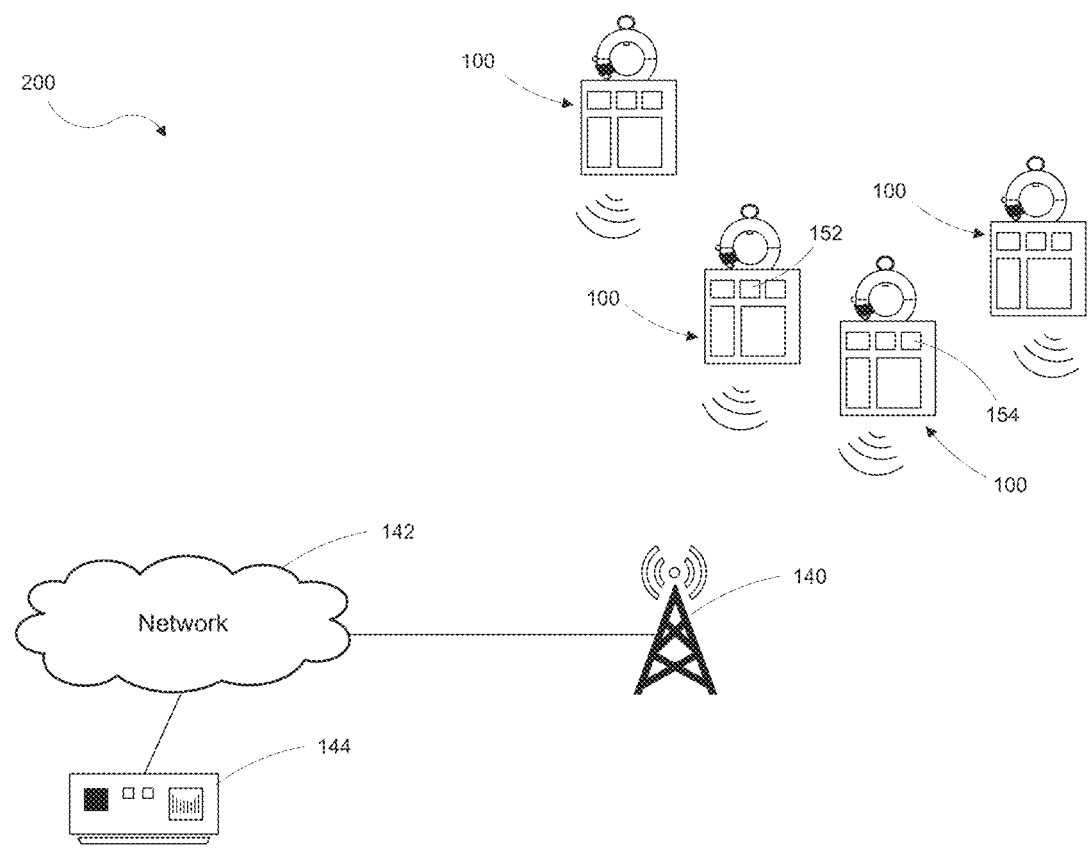
FIG. 3 is a schematic diagram illustrating components which, in some implementations, can be used in a system employing the disclosed technology.

Referring to the power line fault detection system 200 shown in FIG. 3, in the event that a power line sensor 100 detects a line fault (e.g., broken line) the controller can cause the communication module 128 (FIG. 2) to send a report including the power line sensor's location along with the corresponding sensor data to a power station control system 144. The communication module 128 can transmit the report to the power station control system 144 via a wireless tower 140 and a network 142, for example. Once the power station control system 144 receives the report it can immediately de-energize the affected transmission line to help prevent arcing and potential fire. In the event of a falling transmission line, in some embodiments the power station control system 144 can de-energize the affected transmission line before it touches the ground. In addition, to reporting transmission line faults, the power line sensors 100 can periodically send status reports concerning the health of the sensor, such as battery status, sensor diagnostics, and the like. Each power line sensor 100 can include different combinations of sensors. For example, some sensors 100 can include a smoke detector 152 while others can include a noise sensor 154.

Figure 4:
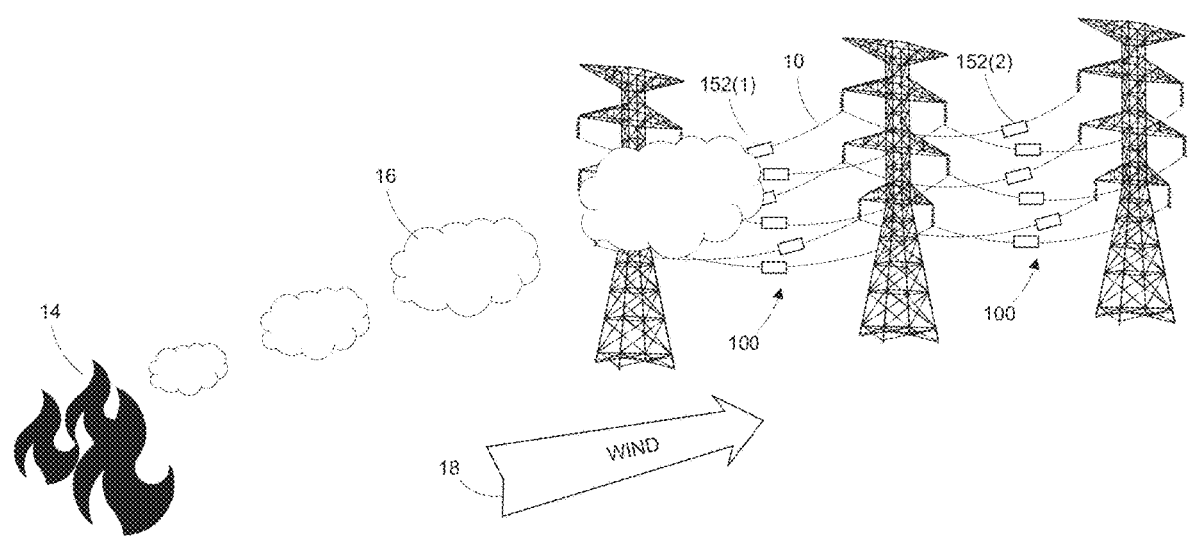
FIG. 4 is a schematic diagram illustrating multiple power line fault detection sensors configured for event location detection.

FIG. 4 illustrates an example of how multiple power line sensors 100 deployed along transmission lines 10 can be used to determine relevant information regarding an event, such as a fire, for example. With multiple smoke detectors 152(1) and 152(2) positioned along the transmission lines at different spaced apart locations, the direction of smoke 16 traveling away from a fire 14 can be determined based on the location code of the sensor that first detects the smoke (e.g., smoke detector 152(1)) as compared to the location code for subsequent sensors that detect the smoke (e.g., smoke detector 152(2)). The general direction and speed of the wind 18 in the area of the fire 14 can be estimated with this information as well as a location of the fire. As another example, the general location of a gunshot or lightning strike can be determined based on the location and timing from multiple spaced apart noise detectors 154 (FIG. 3).

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A drone deployable power line fault detection sensor, comprising:
    a clamp mechanism, including:
        a clamp ring having first and second ring portions movably connected to each other;
        a resilient member positioned to urge the first and second ring portions toward a closed configuration;
        a latch positioned to retain the first and second ring portions in an open configuration whereby the sensor can be positioned on a power transmission line; and
        a trigger coupled to the latch and operative to disengage the latch thereby releasing the first and second ring portions to close around the transmission line under the force of the resilient member; and
    one or more sensors carried by the clamp mechanism positioned to detect a line fault on the power transmission line.

2. The power line fault detection sensor of claim 1, wherein the clamp ring includes a pad eye positioned to facilitate transport via a drone.

3. The power line fault detection sensor of claim 1, wherein the trigger is located in a central opening of the clamp ring.

4. The power line fault detection sensor of claim 1, further comprising a communication module to report a detected line fault to a power station control system.

5. The power line fault detection sensor of claim 1, wherein the one or more sensors includes an electricity sensing induction coil.

6. The power line fault detection sensor of claim 1, wherein the one or more sensors includes an inclinometer.

7. The power line fault detection sensor of claim 1, further comprising a battery and wherein the induction coil is electrically connected to the battery for charging the battery.

8. A method for deploying a power line fault detection sensor, the method comprising:
    retaining a clamp mechanism of the power line fault detection sensor in an open configuration;
    positioning the clamp mechanism on a power transmission line with a drone;
    closing the clamp mechanism around the power transmission line; and
    associating a location code corresponding to the power transmission line with a unique identifier of the power line fault detection sensor.

9. The method of claim 8, wherein associating the location code with the unique identifier comprises storing the location code in the power line fault detection sensor.

10. The method of claim 8, wherein associating the location code with the unique identifier comprises storing the location code and the associated unique identifier in a cross-reference table.

11. A method for power line fault detection and mitigation, the method comprising:
    positioning a power line fault detection sensor on a power transmission line with a drone;
    monitoring an electricity sensor of the power line fault detection sensor;
    reporting changes detected by the electricity sensor to a power station control system via a communication module of the power line fault detection sensor;
    determining a location of the power line fault detection sensor; and
    de-energizing the power transmission line.

12. The method of claim 11, further comprising monitoring an accelerometer of the power line fault detection sensor.

13. The method of claim 11, wherein determining the location of the power line fault detection sensor comprises transmitting a location code from the communication module to the power station control system.

14. The method of claim 11, wherein determining the location of the power line fault detection sensor comprises transmitting a unique identifier corresponding to the power line fault detection sensor from the communication module to the power station control system and cross-referencing the unique identifier with a location code associated with the unique identifier.

* * * * *